US007605390B2

(12) United States Patent
Chen et al.

(10) Patent No.: US 7,605,390 B2
(45) Date of Patent: Oct. 20, 2009

(54) PROGRAMMABLE PHOTOLITHOGRAPHIC MASK BASED ON SEMICONDUCTOR NANO-PARTICLE OPTICAL MODULATORS

(75) Inventors: Zhiyun Chen, Alexandria, VA (US); Gregory D. Cooper, Vienna, VA (US); Serpil Gönen, College Park, MD (US); Erin F. Fleet, Springfield, VA (US)

(73) Assignee: Pixelligent Technologies LLC, College Park, MD (US)

( * ) Notice: Subject to any disclaimer, the term of this patent is extended or adjusted under 35 U.S.C. 154(b) by 0 days.

(21) Appl. No.: 10/730,381

(22) Filed: Dec. 9, 2003

(65) Prior Publication Data

US 2004/0150865 A1 Aug. 5, 2004

Related U.S. Application Data (60) Provisional application No. 60/431,726, filed on Dec. 9, 2002.

(51) Int. Cl.
*H01L 31/0264* (2006.01)

(52) U.S. Cl. ............... 257/17; 257/21; 257/E31.032; 257/E31.122; 977/932; 430/311; 430/5; 359/252

(58) Field of Classification Search .............. 257/21, 257/17; 438/73; 359/252
See application file for complete search history.

(56) References Cited

U.S. PATENT DOCUMENTS

| 4,253,728 | A | | 3/1981 | Venkatesan |
| 5,187,715 | A | | 2/1993 | Weisbuch et al. |
| 5,281,840 | A | * | 1/1994 | Sarma ..................... 257/351 |
| 6,005,707 | A | * | 12/1999 | Berggren et al. ........... 359/322 |
| 6,084,656 | A | * | 7/2000 | Choi et al. ................. 355/71 |
| 6,291,110 | B1 | * | 9/2001 | Cooper et al. .............. 430/5 |
| 6,440,637 | B1 | | 8/2002 | Choi et al. |
| 6,797,412 | B1 | * | 9/2004 | Jain et al. .................. 428/690 |
| 6,819,845 | B2 | * | 11/2004 | Lee et al. ................... 385/122 |
| 6,826,144 | B1 | | 11/2004 | Ichihara et al. |
| 6,927,002 | B2 | | 8/2005 | Hattori et al. |
| 7,190,506 | B1 | * | 3/2007 | Berneth et al. ............. 359/274 |
| 2002/0027647 | A1 | | 3/2002 | Cooper et al. |
| 2002/0182541 | A1 | | 12/2002 | Gonsalves |
| 2003/0117598 | A1 | | 6/2003 | Case et al. |
| 2003/0129545 | A1 | | 7/2003 | Kik et al. |
| 2004/0152011 | A1 | | 8/2004 | Chen et al. |

FOREIGN PATENT DOCUMENTS

WO  WO 03/009058 A2  1/2003

OTHER PUBLICATIONS

U.S. Appl. No. 10/703,075, filed Nov. 2003, Z.Y. Chen et al. (abandoned).

U.S. Appl. No. 10/703,074, filed Nov. 2003, Chen et al. (abandoned).

(Continued)

*Primary Examiner*—Jerome Jackson, Jr.
(74) *Attorney, Agent, or Firm*—Nixon & Vanderhye P.C.

(57) ABSTRACT

Nano-particles are provided with control circuitry to form a programmable mask. The optical characteristics of the nano-particles change to provide patterned light. Such patterned light can be used for example to expose a photoresist on a semiconductor wafer for photolithography.

2 Claims, 10 Drawing Sheets

OTHER PUBLICATIONS

Al.L Efros, et al., "Interband absorption of light in a semiconductor sphere," Sov. Phys. Semicon., 16:772-78 (Jul. 1982).

L.E. Brus, J. Chem. Phys., 79(11), "A simple model for the ionization potential, electron affinity, and aqueous redox potentials of small semiconductor crystallites," 5566-71 (Dec. 1, 1983).

A. Komowski, et al., "*Preparation and Photophysics of Strongly Luminescing $Cd_3P_2$ Quantum Dots*", J. Phys. Chem, 1996, 100: 12467-71.

C.B. Murray, et al., "*Sythesis and Characterization of Monodisperse Nanocrystals and Closed-Packed Nanocyrstal Assemblies*," Annu. Rev. Mater. Sci., 30:545-610 (2000).

S. Nomura, et al., "*Clearly resolved exciton peaks in $CdS_xSe_{1-x}$ microcrystallites by modulation spectroscopy*", Sol. Stat. Comm., 73: 425-9 (1990).

Noharet, Bertrand, "Harnessing light with semiconductor Spatial Light Modulators," Aperturen—Surfaces and Imaging, vol. 1-2001, pp. 12-13, XP002363385 (2001).

Empedocles, S.A. et al., "Quantum-Confined Stark Effect in Single CdSe Nanocrystallite Quantum Dots," Science, 278, 2114 (Dec. 19, 1997).

Gribkovskii , P., V.A. Zyulkov, A.E. Kazachenko, and S.A. Tikhomirov, "*OpticalNnonlinearity of Semiconductor Microcrystal $CdS_xSe_{1-x}$ Under the Action of Picosecond and Nanosecond Llaser Pulses*", 1988, Phys. Stat. Sol. (b) 158: 359-66.

Kageshima, H. et al., "InGaAs/GaAs photorefractive multiple quantum well device in quantum confined Stark geometry." Appl. Phys. B 72, 685-689(2001).

Nagase, et al., "Super-Resolution Effect of Semiconductor-Doped Glass," Jpn. J. Appl. Phys. vol. 38 (1999), pp. 1665-1668, Part 1, No. 3B (Mar. 1999).

Ooki, Hiroshi et al., "Experimental study on non-linear multiple exposure method," SPIE vol. 3051, pp. 85-93, Santa Clara, California (Mar. 12-14, 1997).

Sclafani, A. et al., "Effect of silver deposits on the photocatalytic activity of titanium dioxide samples for the dehydrogenation or oxidation of 2-propanol," J. Photochem. Photobiol. A: Chem. 1991, 59, 181.

Shibuya, Masato et al., "Performance of Resolution Enhancement Technique Using Both Multiple Exposure and Nonlinear Resist," Jpn. J. Appl. Phys. vol. 33 (1994), pp. 6874-6877, Part 1, No. 12B (Dec. 1994).

Zimin, L.G. et al., "*Room-temperature Optical Nonlinearity in Semiconductor-doped Glasses*", Phys. Stat. Sol. (b) 150:653-6 (1988).

Wang, Congjun, et al., "Electrochromic Nanocrystal Quantum Dots," Science, vol. 29, pp. 2390-23921 (Mar. 23, 2001).

T.W.Ebbesen, et al., "Extraordinary Optical Transmission Through Sub-Wavelength Hole Array", Nature, 391, 667 (1998).

F.J.Garcia de Abajo, "Light Transmission Through A Single Cylindrical Hole In A Metallic Film", Optics Express, 10, 1475 (2002).

* cited by examiner

PROGRAMMABLE PHOTOLITHOGRAPHIC MASK BASED ON SEMICONDUCTOR NANO-PARTICLE OPTICAL MODULATORS

CROSS-REFERENCES TO RELATED APPLICATIONS

This application claims the benefit of priority from provisional application No. 60/431,726 filed Dec. 9, 2002, incorporated herein by reference.

This application is related to commonly-assigned application Ser. No. 12/404,472 filed concurrently herewith entitled "Reversible Photo-Bleachable Materials Based On Nano-Sized Semiconductor Particles and Their Optical Applications", the entire disclosure of which is incorporated herein by reference.

FIELD

The technology herein relates to photolithography, and more particularly to programmable masks for use in creating programmable patterned light images. Still more particularly, one exemplary illustrative non-limiting embodiment relates to the use of nano-particles to interact with photons to create patterned light for exposing photoresists, creating displays and for other purposes.

STATEMENT REGARDING FEDERALLY SPONSORED RESEARCH OR DEVELOPMENT

Not applicable.

BACKGROUND AND SUMMARY

Optical Modulator

Generally speaking, optical modulators are devices, which can modify the intensity and/or phase of light passing through them. Applying an electrical voltage modulates most optical modulators. Modern optical modulators have a wide range of applications such as optical communication, displays, metrology, detection, and lithography. Many modern optical modulators, such as Fabry-Perot optical modulators and Bragg optical modulators, are made from semiconductor thin film hetero-structures.

In a semiconductor material, the possible energy states for electrons are grouped into energy bands. These energy bands are separated by band-gaps where no electron states are allowed. The highest populated energy band is called valence band and the lowest unpopulated energy band is called conduction band. When a photon with energy less than the band-gap separating the valence band and conduction band is incident on the semiconductor material it will not be absorbed. However, if the photon has energy higher than the band-gap, it will be absorbed, promoting an electron from the top of the valence band to the bottom of the conduction band. Meanwhile this process will leave an empty electron state, a hole, at the top of the valence band.

A common approach to achieve optical modulation in a semiconductor material is to apply an electrical field with, e.g., an applied voltage to modify the width of the band-gap. One example of this is the Franz-Keldysh effect, which change the band gap directly by applied field. The electron-hole pair created by the photon forms an entity that resembles a hydrogen atom and is called an "exciton". In an exciton, the Coulomb attraction between the electron and hole lowers the energy of the electron relative to the conduction band edge. The excitonic interaction changes the allowed states of the electrons (conduction band) and holes (valence band). An applied electric field modifies or even counters the excitonic interaction, changing the allowed states around the band edge. This, in turn, changes the optical absorption of photons that have energy near the band-gap. The lowest energy where absorption occurs is called the absorption edge. In a sample where at least one dimension is comparable to the exciton size, this effect is also called quantum confined stark effect.

Another effective way to achieve optical modulation is band-filling. By filling up the available states in the conduction band the absorption of photon with corresponding energy will be "bleached". Similarly, if the top of the valence band is filled with holes, the absorption will also be bleached.

For different wavelengths, optical modulators have to be built from different materials that have energy gaps close to these wavelengths. For example, GaAs is mainly used for infrared wavelength, $In_{1-x}Ga_xN$ is used from green to blue light, while $Al_{1-x}Ga_xN$ and $Mg_{1-x}Zn_xO$ can be used for UV spectrum. Therefore, changing the working wavelength can require a change of material system, which can require a lot of effort invested into growing, designing and optimizing devices based on these materials.

Nano-Sized Particles

Some in the past have proposed an experimental basis to use an ensemble of nano-sized particles to fabricate discrete optical modulators. Nano-sized particles are loosely defined as powders with small diameters for example ranging from a few hundred nanometers or less (e.g., down to on the order of 1 nm). Since they have generally only been the focus of research in the last two decades, there is little standardization, and they take many different names including quantum dot, quantum sphere, quantum crystallite, nano-crystal, micro-crystal, colloidal particle, nano-particle, nano-cluster, Q-particle or artificial atom. They also assume different shapes, spherical, cubical, rod-like, tetragonal, single or multiple-walled nanotube, and so on. Due to their small size, they often possess dramatically different physical properties compared to their bulk counterparts. Nano-particles have a wide range of applications including metallurgy, chemical sensors, pharmaceuticals, painting, and cosmetics. As a result of the rapid development in synthesis methods in the last two decades, they have now entered into microelectronic and optical applications. Nano-particles with sizes less than 5 nm have been synthesized from a variety of semiconductors, including C, Si, Ge, CuCl, CuBr, CuI, AgCl, AgBr, AgI, $Ag_2S$, CaO, MgO, ZnO, $Mg_xZn_{1-x}O$, ZnS, HgS, ZnSe, CdS, CdSe, CdTe, HgTe, PbS, BN, AlN, $Al_xGa_{1-x}N$, GaP GaAs, GaSb, InP, InAs, $In_xGa_{1-x}As$, SiC, $Si_{1-x}Ge_x$, $Si_3N_4$, ZrN, $CaF_2$, $YF_3$, $Al_2O_3$, $SiO_2$, $TiO_2$, $Cu_2O$, $Zr_2O_3$, $ZrO_2$, $SnO_2$, $YSi_2$, $GaInP_2$, $Cd_3P_2$, $Fe_2S$, $Cu_2S$, $CuIn_2S_2$, $MoS_2$, $In_2S_3$, $Bi_2S_3$, $CuIn_2Se_2$, $In_2Se_3$, $HgI_2$, $PbI_2$. They have revealed very interesting electrical and optical properties.

A characteristic of a nano-particle is its size, which can affect the physical properties. If a nano-particle is small enough, the electron and hole energy can be quantized into discreet levels instead of the continuous bands of bulk materials. Furthermore, the electrons and holes may be confined much closer to each other than in bulk. Therefore, the Coulomb interaction between electrons and holes is much stronger. For optical applications, it is convenient to categorize semiconductor nano-particles relative to their bulk exciton size, $a_B$. If the size of a particle, $a > a_B$, it is in the weak confinement regime. If $a < a_B$, then it is in the strong confinement regime.

In the weak confinement regime, the nano-particles can still be treated as basically bulk materials that are slightly perturbed. The quantization of the electron and hole energy is much less than the quantization of the exciton energy levels. Therefore the change in optical properties is mainly due to the change of exciton energy. A qualitative formula for the exciton ground state is expressed in equation (1), as described in an article by Al. L Efros, A. L. Efros, Sov. Phys. Semicon., 1982, 16:772-78, $$\hbar\omega = E_g - E_x + \frac{\hbar^2\pi^2}{2(m_e + m_h)a^2} \quad (1)$$

where $E_g$ is the band-gap for the bulk, $E_x$ is the exciton ground energy for the bulk value, $m_e$ and $m_h$ are the effective masses of the electron and hole respectively, $\hbar$ is the Plank constant and $\omega$ is the angular frequency of the photon. This formula treats the excitons Coulomb interaction as a hydrogen-like entity. The last term in this equation indicates that the absorption peak energy corresponding to the exciton increases rapidly with size reduction.

In the strong confinement case, the nano-particle cannot be treated as bulk materials and the Coulomb interaction can not be described as a hydrogen-like entity. The energy levels for electrons and holes no longer form continuous bands. Instead, they form discreet levels, like in atoms or molecules. A simplified model for the absorption edge energy of nano-particles in the strong confinement regime is described in equation (2), as described in an article by L. E. Brus, J. Chem. Phys. 1983, 79:5566-71, $$\hbar\omega = E_g - \frac{1.8q^2}{\kappa a} + \frac{\hbar^2\pi^2}{2(m_e + m_h)a^2} \quad (2)$$

where $E_g$ is the bulk band-gap, $m_e$ and $m_h$ are the effective masses of the electron and hole respectively, q is the electron charge, $\kappa$ is a constant, $\hbar$ is the Plank constant and $\omega$ is the angular frequency of the photon. In equation (2), the absorption edge again increases rapidly with decreasing size.

Figure 1A:
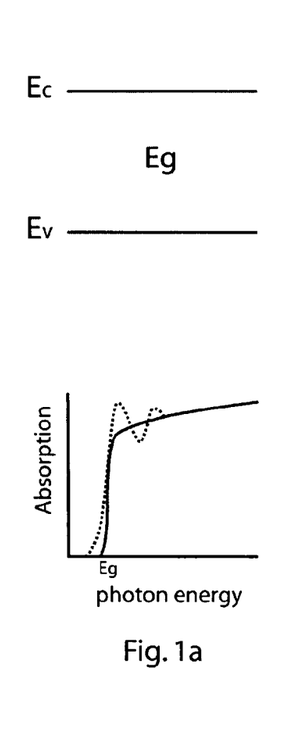
FIG. 1a shows an exemplary band and absorption diagram for a prior art bulk semiconductor without considering interaction between electrons and holes (the dotted lines illustrate exemplary absorption spectrum change under an applied electric field)
Figure 1B:
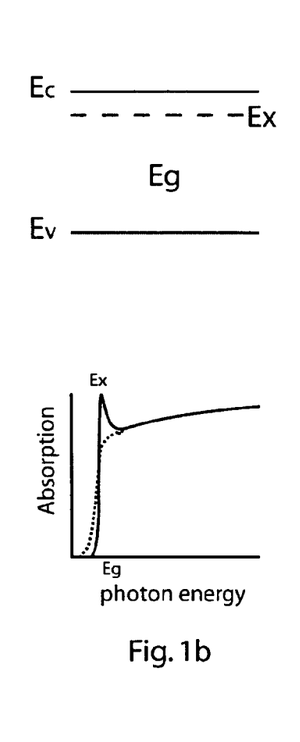
FIG. 1b shows an exemplary band and absorption diagram for a prior art bulk semiconductor that considers interaction between electrons and holes (the dotted lines illustrate exemplary absorption spectrum change under an applied electric field)

FIG. 1a is an exemplary ideal band diagram and the absorption spectrum of a prior art semiconductor without considering the interaction between electrons and holes. FIG. 1b is a band diagram and absorption spectrum of a prior art semiconductor when the Coulomb interaction between and electrons and holes are included. The exciton energy level is usually slightly lower than the conduction band, as depicted by the dashed line.

Figure 1C:
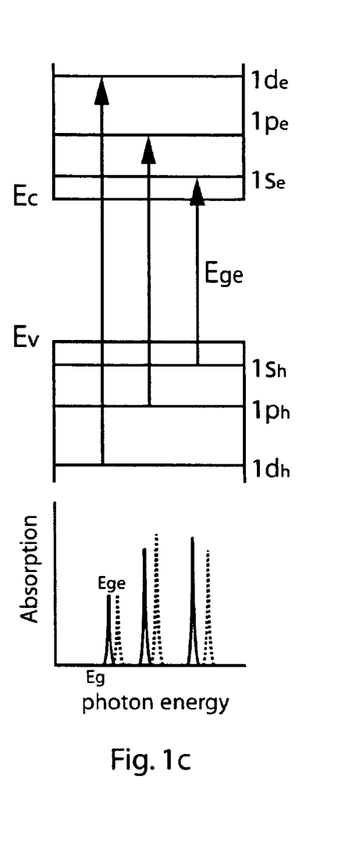
FIG. 1c shows an exemplary electronic structure and absorption spectrum of an illustrative prior art nano-particle structure in a strong confinement regime (the dotted lines illustrate exemplary absorption spectrum change under an applied electric field)

FIG. 1c is the electronic structure and absorption spectrum of a prior art nano-particle under strong confinement conditions. The energy bands are quantized into discreet levels and are labeled as 1s, 1p, 1d, as in the case of atomic levels. The lowest energy levels of the electrons and holes increase as the size goes down. Therefore the effective band-gap of the material, $E_{ge}$, goes up quickly as indicted in equation (2). This band-gap widening effect has been observed in many materials. For example, the band-gap of $Cd_3P_2$ increases from its bulk room temperature value of 0.5 eV to about 2 eV for nano-particles with 2.7 nm diameter.

The most apparent mechanism of light modulation with external electrical field in nano-crystals includes:

Franz-Keldysh effects. An electric field alters the effective band-gap of a semiconductor, as shown in the dotted line in FIG. 1a.

Excitonic effect. Or quantum confined Stark effect in the case of nano-crystal. Since the excitons result from the Coulomb interaction between electrons and holes, an external electrical field will shift or even dis-associate exciton energy levels, as shown in the dotted line in FIG. 1b.

Band filling. By filling up the bottom of the conduction band with electrons, or the top of the valence band with holes, or both, the absorption can be suppressed.

For nano-particle in the strong confinement regime, the quantization of electron and hole levels strongly depends on boundary conditions such as shape, size, solvent, and external electrical field. Therefore changing external electrical field can modify the electronic structure and, hence, the absorptivity of the nano-particles, as shown in the dotted line in FIG. 1c.

Non-linear optical effects such as Pockels effect and Kerr effect where the refraction index of the material depends on the external electrical field. Such effects could provide for refractive index changes in Bragg modulators, modify the reflection at the interface of the nano-particle layers or change the polarization of the transmitted light.

There are a variety of ways to manufacture nano-particles, including chemical vapor deposition (CVD), chemical mechanical polishing (CMP), self-organized growth on suitable substrates in various film deposition techniques, laser ablation, plasma assisted decomposition, sol-gel synthesis, electro-explosion, and chemical synthesis. Nano-particles with average particle size as small as a few Angstroms and with different shapes can be produced. Nano-particles can be sheathed in a shell made of different materials. It is feasible to manipulate monodisperse (standard deviation of the size distribution is smaller than 5%) nano-particles into ordered or disordered close-packed assemblies possessing very different properties from their bulk counterparts. A review of monodisperse nano-particles can be found for example in an article by Murray, Kagan, Bawendi, "Synthesis and Characterization of Monodisperse Nanocrystals and Closed-Packed Nanocrystal Assemblies", *Annual Review of Material Science* 30:545-610 (2000).

We have realized that it would be especially useful to fabricate an array of optical modulators based on semiconductor nano-sized particles for use in photolithography and other applications. Such programmable photomasks made from arrays of the nano-particle based optical modulators preferably include control circuitry to control each modulator. In such an array, the active parts of the modulators can be formed by nano-sized semiconductor particles, which may be organized in a variety of ways, including colloidal or otherwise suspension, compressed solid, or quasi-crystals. In such exemplary modulators, the intensity and/or phase of light transmit through or reflected by them can be controlled by applying an electrical field to these modulators.

In accordance with one aspect of a presently preferred exemplary illustrative embodiment, a programmable mask comprises:

a plurality of optical modulators arranged in an array, said plurality of optical modulators each including at least one nano-particle; and a control arrangement operatively coupled to said optical modulators, said control arrangement applying a stimulus to said nano-particles to thereby cause said nano-particles to change optical properties.

The nano-particles may comprise semiconductors. The nano-particles can have sizes in the range of about 1 nm to about 100 nm, or greater than 100 nm or less than 1 nm. A pattern control generator may be coupled to said control arrangement to apply control signals defining a programmable light exposure pattern. The control arrangement may include control circuitry disposed at each of said nano-particles. The control arrangement may apply an electrical voltage to said nano-particles. The control arrangement may apply an electrical current to said nano-particles. The control arrangement may apply an electric field to said nano-particles. The control arrangement may apply a light stimulus to said nano-particles.

The programmable mask may include a silicon substrate, and said control arrangement includes electrical paths disposed on said silicon substrate. The programmable mask may include a silicon on sapphire substrate and said control arrangement includes active devices disposed on said substrate. The programmable mask may include an array of sub-wavelength holes on metallic films. The programmable mask may include a silicon-on-sapphire substrate with said control arrangement and includes active devices disposed on another sapphire substrate. These two wafers are then fused together to form a complete functioning mask. The programmable mask may include a substrate having back-etched portions to provide a light path therethrough, said nano-particles being optically coupled to said back-etched portions. The nano-particles may comprise a polymer matrix. The nano-particles comprise materials selected from the group consisting of C, Si, Ge, CuCl, CuBr, CuI, AgCl, AgBr, AgI, $Ag_2S$, CaO, MgO, ZnO, $Mg_xZn_{1-x}O$, ZnS, HgS, ZnSe, CdS, CdSe, CdTe, HgTe, PbS, BN, AlN, $Al_xGa_{1-x}N$, GaP GaAs, GaSb, InP, InAs, $In_xGa_{1-x}As$, SiC, $Si_{1-x}Ge_x$, $Si_3N_4$, ZrN, $CaF_2$, $YF_3$, $Al_2O_3$, $SiO_2$, $TiO_2$, $Cu_2O$, $Zr_2O_3$, $ZrO_2$, $SnO_2$, $YSi_2$, $GaInP_2$, $Cd_3P_2$, $Fe_2S$, $Cu_2S$, $CuIn_2S_2$, $MoS_2$, $In_2S_3$, $Bi_2S_3$, $CuIn_2Se_2$, $In_2Se_3$, $HgI_2$, $PbI_2$. The nano-particles may in the form of sphere, cube, rod, tetragonal, single or multiple-walled nanotube, or other nanoscale forms.

Another illustrative aspect provides a preferred exemplary method of exposing a surface comprising: stimulating nano-particles based on pattern data to change the optical characteristics thereof; directing photons toward said stimulated nano-particles to generate a pattern of photons corresponding to said pattern data; and exposing a surface with said photon pattern. The surface may comprise a photoresist. The photon pattern may comprise a two-dimensional pattern. The nano-particles can be arranged in an array forming a plurality of discrete optical modulators. The stimulating may comprise applying a current, voltage or field to said nano-particles.

An illustrative non-limiting process for fabricating a programmable mask comprises providing a substrate having control circuitry thereon; and applying nano-particles to at least a portion of said substrate. The applying may comprise mixing nano-particles with a liquid and interacting said liquid with said substrate. The interacting may comprise spraying said liquid onto said substrate, spinning said liquid onto said substrate, or dipping said substrate into said liquid. The liquid may comprise a polymer, an organic solvent, or water. The applying may involve said nano-particles to said substrate to define a pattern. The substrate may comprise silicon or silicon-on-sapphire. The process may further include back etching portions of said substrate to provide light-transparency. The applying may comprise using CVD, laser deposition, colloidal precipitation or plasma deposition. The process may further include operating said control circuitry during said applying.

Another illustrative non-limiting process for fabricating a programmable mask comprises providing a substrate having control circuitry thereon; and another substrate with nano-particles on at least a portion of said substrate. And the second substrate be flipped and bonded to the first substrate.

When electrons from inner shells of semiconductor atoms are excited into the conduction gap, they can absorb lights in the EUV and soft X-ray spectra. By manipulating the filling of the conduction band by modifying the depletion region, the absorption edges associated with the deep electrons can also be changed. Therefore another illustrative non-limiting application will be optical modulators for EUV and soft X-ray applications.

Such an array of optical modulators based on nano-particles have advantages over conventional solid-state modulators, including for example:

The absorption edge is almost continuously tunable by tuning the particle size, as qualitatively shown in equations (1) and (2) above. Therefore, the choice of materials for a given application is much broader.

Due to the confined space, the probability of direct recombination of the electron and hole, a radiative process in which a photon is emitted, is much reduced. Because of the small spatial dimension of the nano-particles, momentum conservation can be violated in particle interactions. Removing momentum conservation and including the increased overlapping of electron and hole wave functions make non-radiative many particle process, such as Auger recombination, more likely to happen. The exciton recombines through phonons rather than photons. The non-radiative recombination can make some optical devices, such as a modulator, more efficient, since there is less "stray light" being emitted by the device.

The handling and processing of nano-particles can be more economical than thin film growth. For example, in GaAs, to enhance the exciton energy by quantum confinement, fabrication and optimization of a multiple quantum well (MQW) by metal-organic chemical vapor deposition (MOCVD) or molecular beam epitaxy (MBE) is employed. These processes are expensive and complicated. In addition, not all semiconductors can be made into MQW presently. Issues like suitable substrates, growth conditions, thermal budget, and strains can limit the final performance of the devices. Nano-particles can be synthesized and assembled by chemical methods on literally any substrate. These chemical processes are potentially cheaper and more forgiving than MOCVD and MBE. The particles experience no or little strain, thereby reducing the complications associated with thin film hetero-structures. Plus, a greater variety of semiconductors can potentially be made in the form of nano-particles. Finally, using bulk-form semiconductors can limit material choices, where one has to select from a limited number of materials to operate at a given photon wavelength. For example, to work at UV wavelengths, some materials such as Si and GaAs may not be desirable because their band-gaps are too small. However, one can potentially engineer a, for example, GaAs nano-particle for UV applications by simply making the GaAs nano-particle small enough.

Nano-particles can be synthesized and handled at room temperature or slightly elevated temperatures. This is exceptionally appealing for integration with silicon circuit. No special care has to be taken to reduce the thermal budget. This advantage offers simplicity in the embodiments for programmable photolithography masks where large arrays of optical modulators are integrated with silicon control circuit. The indispensable requirement of programmable lithographic mask is densely integrated optical modulators operating at high speed, high uniformity and high reliability.

BRIEF DESCRIPTION OF THE DRAWINGS

These and other features and advantages will be better and more completely understood by referring to the following detailed description of presently preferred illustrative embodiments in conjunction with the drawings, of which:

FIG. 5 another exemplary modulator that consists of two metal films separated by a thin insulator. This assembly has a hole in the middle that is filled with nano-particles.

A method of fabricating the active layer and the control circuitry separately (FIG. 8a) and gluing them together to form the modulator (FIG. 8b);

FIG. 9 shows two more specific embodiments of the flip-chip structures based on band-filling modulators.

DETAILED DESCRIPTION OF PRESENTLY PREFERRED EXAMPLE ILLUSTRATIVE NON-LIMITING EMBODIMENTS

Figure 2A:
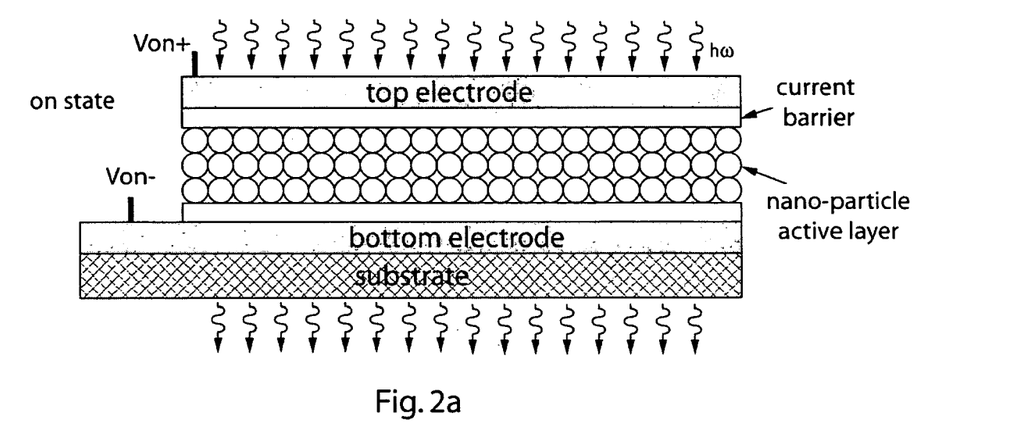
FIGS. 2a and 2b show an exemplary vertical optical modulator structure using nano-particles in transparent and opaque states, respectively.
Figure 2B:
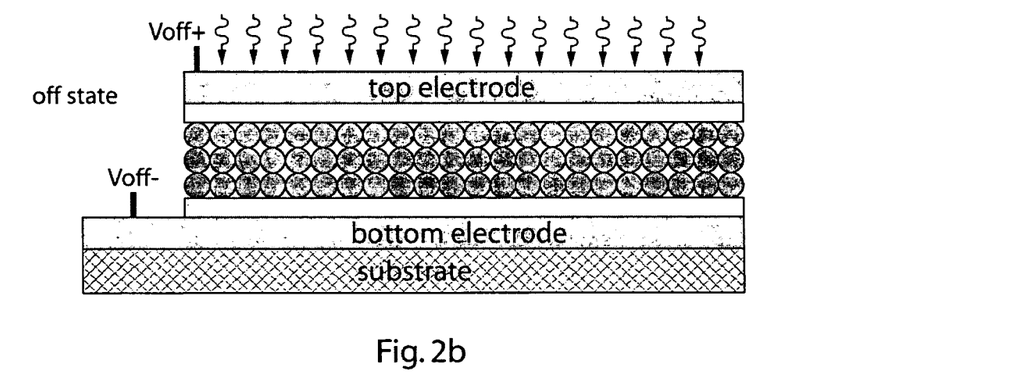

The first exemplary embodiment of a nano-particle optical modulator is demonstrated in FIG. 2. An ensemble of nano-particles is sandwiched between two electrode-bearing substrates. The insulator supplies a current barrier. If the nano-particle ensemble itself is resistive enough to maintain a high electrical field then this barrier is not necessary. If the modulation is operated by current, the thickness of the current barrier has to be duly adjusted. The geometry is transmissive, so the optical path through the modulator needs to be relatively transparent. In the example shown, the substrate, electrodes, and insulators are transparent. One could consider manufacturing a window through an opaque region to provide an optical path through the device. A voltage is applied between the two electrodes to switch the modulator between on and off states. For light at the working wavelength, at on state the device is highly transparent while at off state the device is almost opaque. (Note that voltage on can correspond to either modulator on or off. For example, 0 Volts could be transparent (on), while non-zero voltage could be opaque (off).)

Figure 3A:
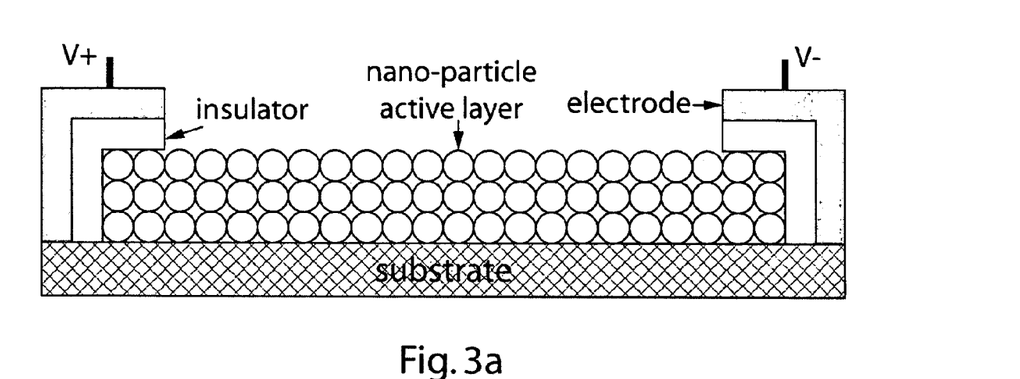
FIG. 3a shows an exemplary lateral optical modulator structure using nano-particles.
Figure 3B:
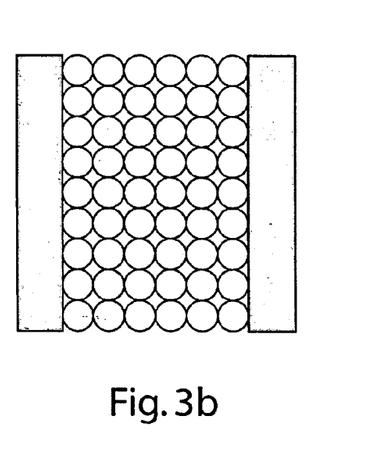
FIG. 3b shows a top view of an exemplary electrode for generating electric fields in the FIG. 3a embodiment.
Figure 3C:
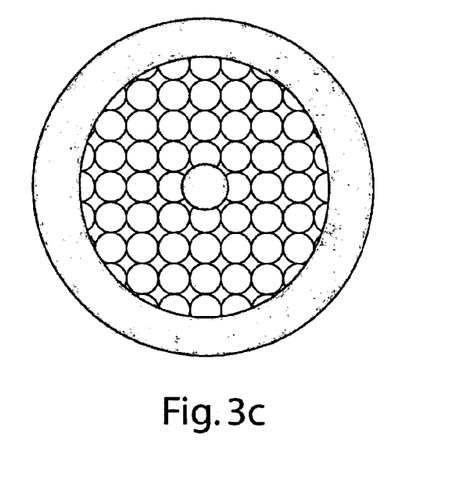
FIG. 3c shows a top view of an alternative, concentric electrode.

The device structure can also be lateral, as shown in FIG. 3a. In this embodiment the nano-particle ensemble is sandwiched horizontally between the two electrodes. In this case the electrodes do not have to be transparent, which could render some freedom to the device design. The insulator again serves as a current barrier. If the modulation is operated by current, the thickness of the current barrier has to be duly adjusted. To ensure uniform field distribution, one could use a variety of electrode geometries, including parallel electrodes and concentric rings, which are shown in FIG. 3b and FIG. 3c respectively.

Figure 4A:
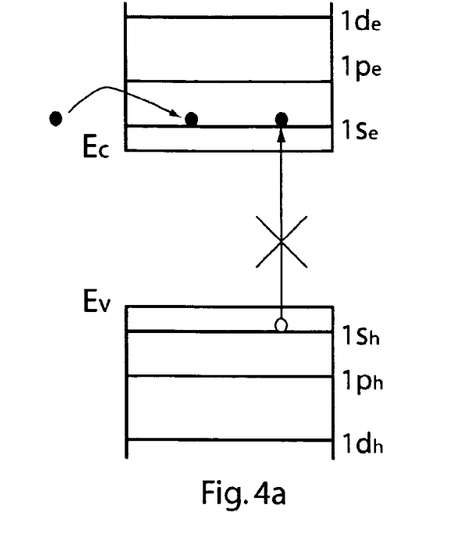
FIG. 4a shows a process where an outside electron placed in the valence band of a nanocrystal prevents excitation of an electron from the valence band and therefore bleaches the absorption.
Figure 4B:
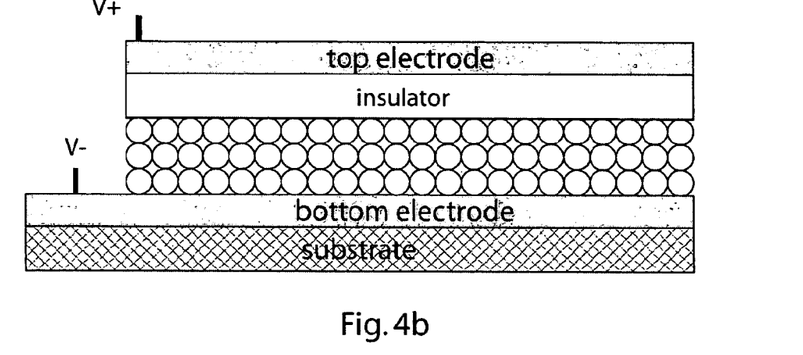
FIGS. 4b and 4c show exemplary vertical optical modulator where the nano-particles are in contact with the bottom electrode and they act as an electrode.

Two specific exemplary illustrative embodiments for band-filling modulator are shown in FIG. 4. As stated before, by filling up the bottom of the conduction band or the top of the valence band, optical absorption at the band edge can be completely blocked. As illustrated in FIG. 4a. This type of devices requires charging or discharging of the nano-particles. In FIG. 4b, it is realized by capacitive charging. There is no barrier between the bottom electrode and the nano-particles. Charges can be sent in and out of the nano-particles by changing the voltage between the top and bottom electrodes.

Figure 4C:
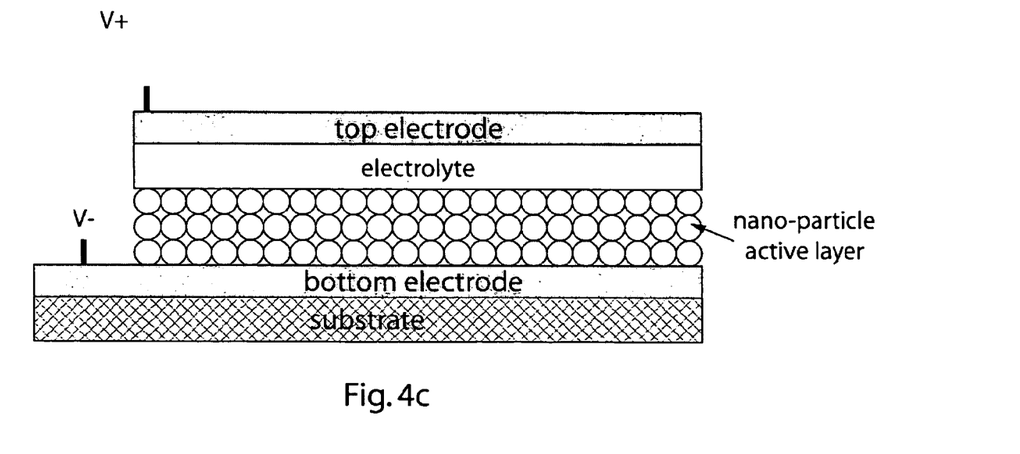

Another method to populate the conduction band with electrons is to form an electrochemical cell where electrons flow from one electrode to the others in the presence of an electric field. Since in semiconductors the valence band is full the extra electrons would occupy the lowest levels in the conduction band. Since now the lower levels of the valence band is full, photons will not be absorbed, they will be transmitted. In FIG. 4c, the insulator is replaced with suitable electrolyte. By altering the voltage between the top and bottom electrodes, certain electro-chemical reactions will charge or discharge the nano-particles. Electrolyte can be a solid, liquid or polymer. In this example, the electrolyte and the products of the electro-chemical reactions have to be transparent to the working wavelength. Electrodes may or may not be completely transparent. A good example of the principle of this type of modulator was demonstrated in an article "Electrochromic Nanocrystal Quantum Dots", Congjun Wang, M. Shim, and Philippe Guyot-Sionnest, Science, 291, 2390 (2001).

Another exemplary illustrative embodiment is the combination of nano-particles and sub-wavelength holes on a metallic thin film. A hole with diameter smaller than the wavelength of the incident light on a metal thin film shows novel light transmission ability. At certain combination of wavelength, hole diameter and film thickness, the transmission cross section can be several times larger than the hole itself. This was first demonstrated in an article "Extraordinary Optical Transmission Through Sub-Wavelength Hole Array", T. W. Ebbesen, H. J. Lezec, H. F. Chaemi, T. Thio, and P. A. Wolff, Nature, 391, 667(1998). This effect is enhanced if the hole is filled with a dielectric material and is sensitive to the properties of the filling material. An example of analysis can be found in the an article "Light Transmission Through A Single Cylindrical Hole In A Metallic Film", F. J. Garcia de Abajo, Optics Express, 10, 1475(2002).

Figure 5A:
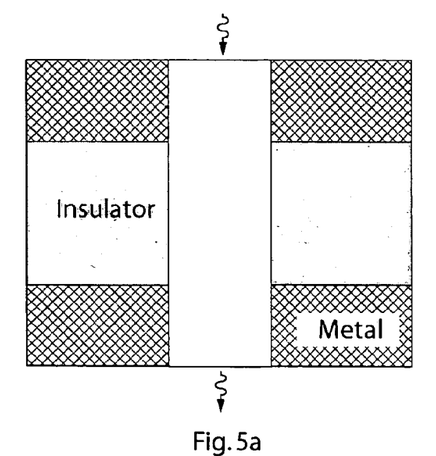
FIGS. 5a and b are before and after a voltage is applied to the metal layers, respectively.
Figure 5B:
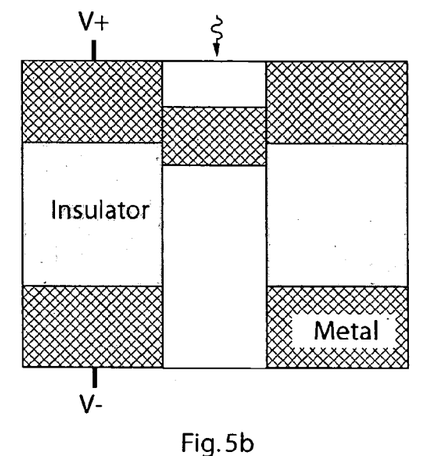
Figure 5C:
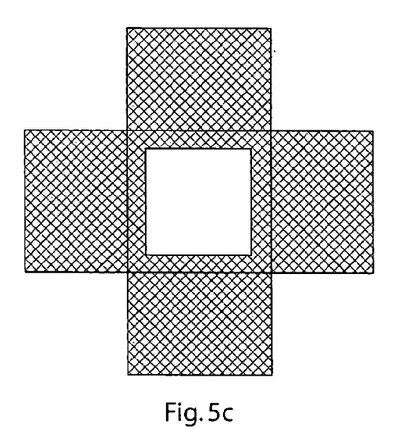
FIG. 5c is the top view.

Our embodiment is shown in FIG. 5. The modulator is constructed with two metal films separated by a thin insulator. A sub-wavelength hole filled with nanocrystal is punctured throughout the structure. The wavelength, diameter of the hole and the thickness of the films are duly designed. Without voltage applied between the two metal films, the light can be transmitted through the hole with extraordinary intensity, as shown in FIG. 5a. When an voltage is applied between the top an bottom metal films, there are charges accumulated near the surface of the dielectric filling. There the top layer has almost a continuous metallic behavior and the light transmission is blocked. As shown in FIG. 5b. FIG. 5c is the top view of such a structure.

Another exemplary illustrative embodiment is the application of ultraviolet (UV) optical modulators in the programmable mask for programmable lithography. Programmable masks are programmable pattern generators that are used in lithography to process integrated circuits. One type of programmable mask is an array of wide band-gap optical modulators or optical amplifiers. Each unit can be individually controlled to transmit either a high or low intensity of light. When all of the modulators are individually programmed to either the high or low state, an overall pattern of light is transmitted through the device. This patterned light is then used to expose a photosensitive compound on the wafer to be processed. A detailed description of the programmable mask and the corresponding lithography system can be seen in U.S. Pat. No. 6,291,110 B1, Cooper, et al. Contemporary photolithography operates at 365 nm, 248 nm, 193 nm and 157 nm. Modulators and masks working at these wavelengths are needed.

Figure 6:
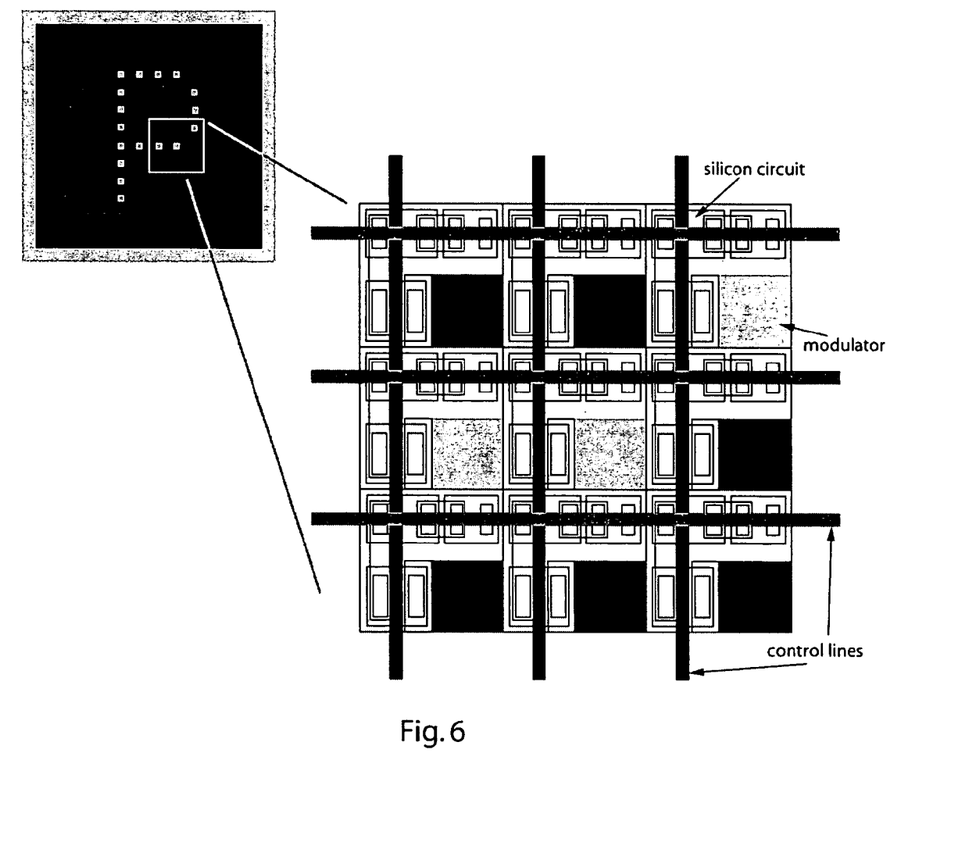
FIG. 6 shows an exemplary illustrative programmable mask arrangement including control circuitry, data lines and nano-particle modulators in various exemplary states.

A demonstrative picture of the programmable mask is shown in FIG. 6. The overall architecture of mask resembles those of silicon memory chips, with control circuit surrounding each pixel. To increase the efficiency of the mask, the number and density of modulators should be high. In this architecture, each pixel is individually addressable therefore the control circuit has to operate at very high speed. A variety of technologies could be used for the control circuit, including GaAs, Si, SiGe, GaN, etc.

One example to integrate silicon with wide band-gap materials is to fabricate silicon circuit with wide band-gap materials on common silicon-on-sapphire (SOS) substrate, as proposed in U.S. patent application, "Method For Making High-Density Programmable Masks By Integrating Other Semiconductor Optical Devices With Silicon-On-Sapphire Technology", Z. Y. Chen et.al. In this example, however, epitaxial wide band-gap semiconductor hetero-structures have to be grown along with silicon devices.

Figure 7A:
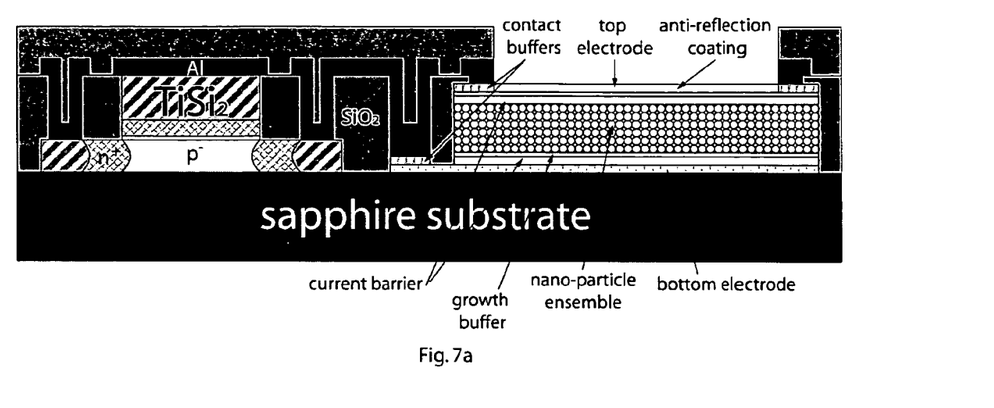
FIG. 7a shows an illustrative cross-section of an exemplary programmable mask pixel vertical modulator structure and associated control circuitry.

If semiconductor nano-particle optical modulators are used, things could be different. As shown in FIG. 7a, the silicon circuit on sapphire substrate can be fabricated first, leaving places for modulators. The UV transparent bottom electrode, such as indium tin oxide (ITO), thin nickel, n-$Al_xGa_{1-x}N$, n-$Mg_xZn_{1-x}O$, is then put down. If the resistivity of nano-particle assembly is too low, a thin layer of insulator is deposited on top as a current barrier. This buffer layer could have a high affinity with the nano-particles so they would selectively assemble on it in amorphous or periodical form. Nano-particles, such as ZnO, AlN, $Mg_xZn_{1-x}O$ —can be assembled by spraying, spin-on coating, laser ablation, plasma assisted decomposition, or precipitation under colloid submersion. Another current barrier, if necessary, is inserted before the top electrode. Top UV transparent electrode is then deposited. An antireflection coating can be used to reduce the reflection at the surface of the electrode. The contact buffers offer better mechanical attachment and ohmic electrical contact to the electrodes. All the layers involved here do not have to be epitaxial, therefore, they all can be grown at fairly low temperatures. The properties of silicon devices will not be affected during these processes. After the modulators are built, interconnects with silicon can be fabricated.

Figure 7B:
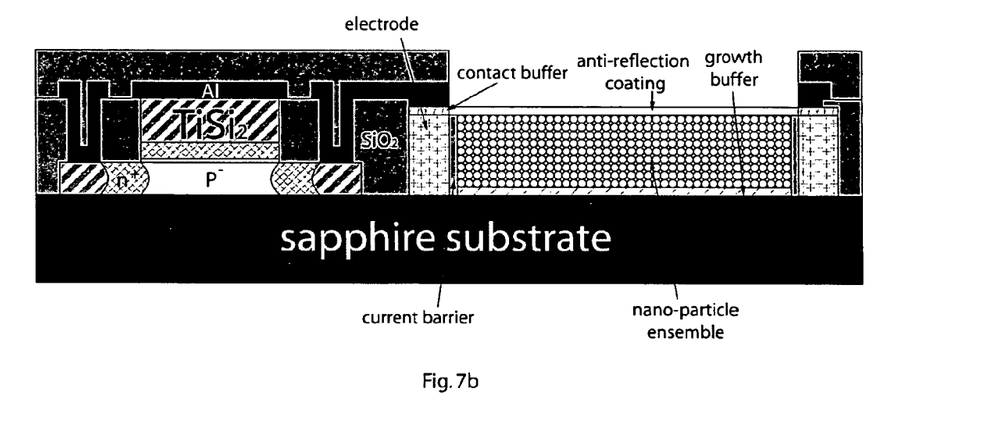
FIG. 7b shows an illustrative cross-section of an exemplary programmable mask pixel lateral modulator structure and associated control circuitry.

FIG. 7b is a similar design but with a lateral electrode configuration. In this design the electrodes and current barriers are not in the path of light, therefore, there is no light-loss in the layers and at the interfaces. The electrodes can be fabricated during the silicon process. For example, the electrodes can be made of n doped poly-silicon and then oxidized to form a thin layer of $SiO_2$ to serve as a current barrier.

Figure 8A:
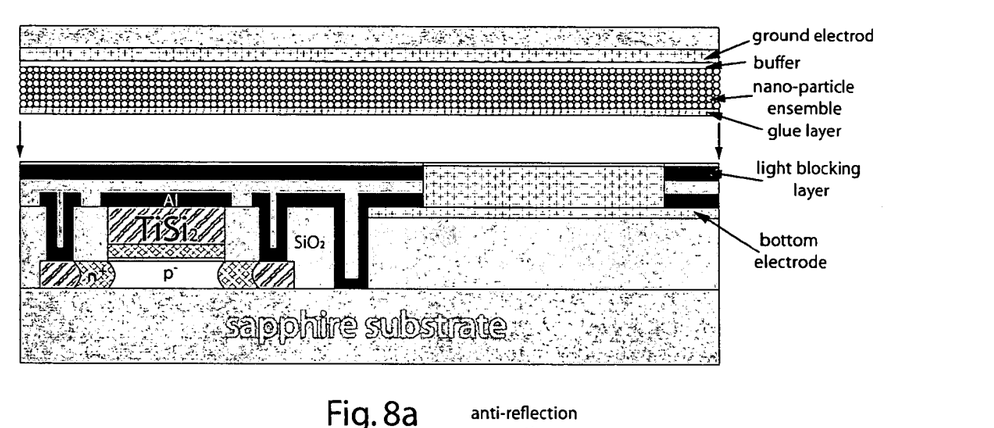
Figure 8B:
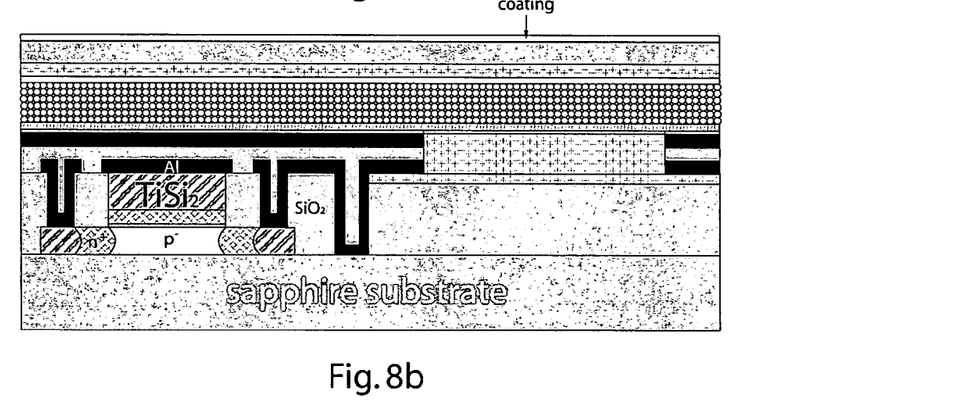

Another illustrative embodiment is to use the flip-chip self-alignment technique in fabricating the programmable mask. As shown in FIG. 8. In this embodiment, the silicon control circuit is built on a silicon-on-sapphire wafer and nano-particles are deposited on another sapphire substrate with ground electrode and buffer layer. A glue layer is also applied on top of the nano-particle. Then the second wafer is flipped and press bonded to the first wafer as shown in FIG. 8b. Because the light blocking layer block light everywhere except the pixels, the field created between the ground and gate electrodes only modulates the pixel area. After the bonding, the sapphire substrate on the top is thinned down and an anti-reflection coating is put down. In this design, the silicon circuitry and optical modulator fabrications are completely separated. Furthermore, no special alignment is needed to bond the two wafers together. This embodiment greatly simplifies the fabrication process. A similar process is described in an article "Wafer-Scale Processing Leads To Low-Cost Optical Integration", William Water, William Clark, Compound Semiconductor, January, 2003.

Figure 9A:
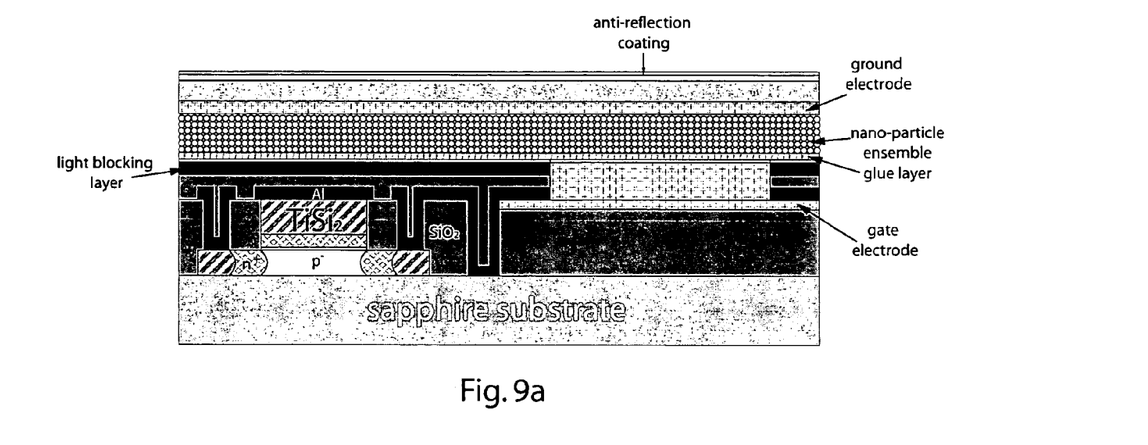
In FIGS. 9a and 9b the band filling is realized by capacitive charging and electro-chemical process, respectively.
Figure 9B:
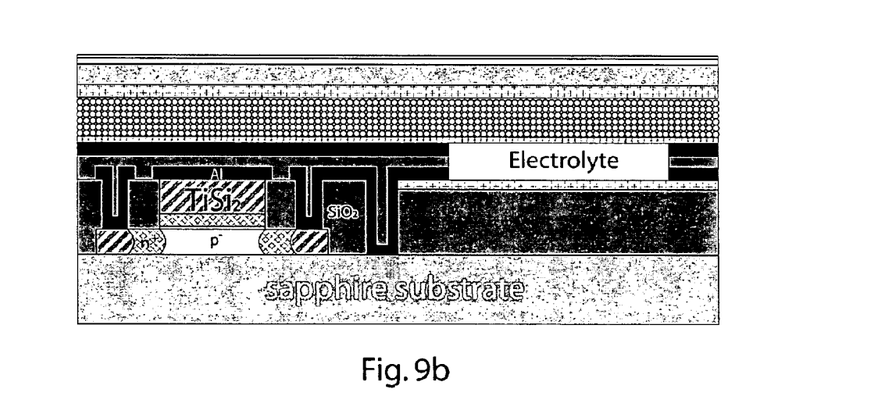

FIG. 9 shows two more specific embodiments of the flip-chip structure. These are based on band-filling modulators. In FIG. 9a, the band filling is supplied by capacitive charging. The process is very similar to FIG. 8 except that the nano-particles are in direct contact with the ground electrode or with a highly conductive buffer. The capacitor is formed across the thin insulator on top the gate electrode. In FIG. 9b, electrolyte replaces the thin oxide and the band filling is realized by electro-chemical process.

Figure 10:
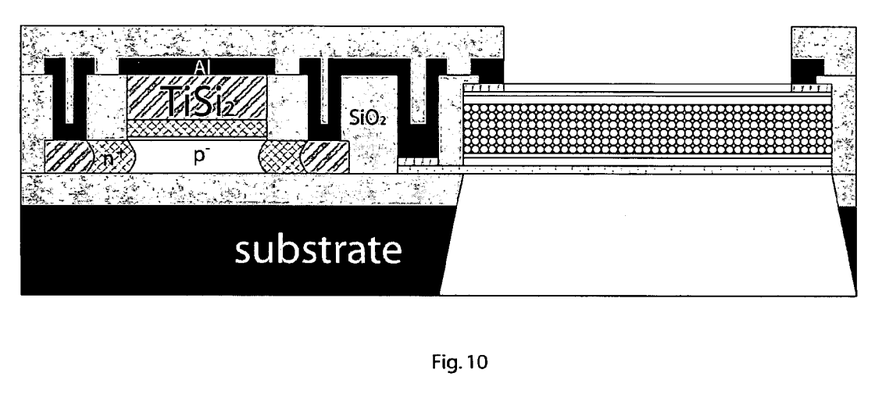
FIG. 10 shows an illustrative cross-section of an exemplary programmable mask pixel, vertical modulator structure and associated control circuitry with back-etched substrate

For opaque substrates, a transmissive device can also be made by back-etching the substrate to the pixel. FIG. 10 illustrates the programmable mask built on silicon-on-insulator substrate, where the insulator is silicon dioxide. The procedure to build this mask is similar to the previous embodiments, except that after the modulator is built, the substrate is etched back to the pixel. Only vertical geometry is shown in FIG. 10. This embodiment can be readily applied to other structures. The growth buffer in these structures should be mechanically strong enough to support the modulator without the substrate. The substrate may be thinned down to ease the process. To improved mechanical strength, after the back-etching the said wafer can be further transferred to a transparent substrate such as sapphire.

For opaque substrates, the mask can also be built in reflection mode.

If nano-sized structures are assembled into periodical patterns with periods comparable to the working wavelength, they are called photonic crystals. Only a photon with a certain wavelength and direction can exist in a photonic crystal, similar to the band-gap in an atomic crystal. Those wavelength not allowed in a photonic crystal will be transmitted or reflected without absorption. The photonic bands are dependent on the individual particle. Therefore, by modulating the nano-particles with an external field, the photonic band can be shifted, thereby changing the transmitted or reflected light. Therefore, an optical modulator made of a nano-particle photonic crystal could work in either the transmission or reflection mode. The simplest photonic crystal modulator is the Bragg modulator. A Bragg modulator can be made with nano-particles by replacing the thin films by alternating layers of nano-particles, where the nano-particle size and/or composition is different in each of the 2 layers.

Another illustrative embodiment of a programmable mask is to build an array similar to FIG. 6 using the optical modulator described in FIG. 5. The modulator can be simply sandwiched between and the bit line and word line at their crossover.

Another illustrative embodiment of a programmable mask is to build an array similar to FIG. 6 using the optical modulator described in FIG. 5. In most cases the size of the sub-wavelength hole is in the order of tens of nanometers. Furthermore, the entire structure is highly metallic and the speed of the circuit is not a great concern in many applications. Therefore the silicon control circuit can be placed away from the modulator array.

The silicon n-MOSFET device shown in all the previous embodiments is solely for demonstrative purpose. Real device and circuit designs could be altered according to specific designs.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the scope of the appended claims.

The invention claimed is:

1. A process for operating an electrically modulated programmable mask for optical lithography comprising:

Illuminating, with a light of one of the lithographic wavelengths of 248 nm, 193 nm or 157 nm, a sapphire substrate having electrical control circuitry thereon, and further having at least a thin layer of semiconductor nano-particles with a bandgap disposed on to at least a portion of said substrate, said bandgap corresponding to the energy of said wavelength;

applying, voltage or current to induce nano-particles in said thin layer to change transparency thereby controllably absorbing or transmitting at one of said lithographic wavelengths of 248 nm, 193 nm or 157 nm, said nano-particles thereby providing optical modulation at said wavelength; and exposing a semiconductor wafer with a spatial light pattern responsive to said applied voltage or current.

2. A process for operating an electrically modulated programmable mask for optical lithography comprising at least one optical modulator operable at the lithographic wavelength of 365 nm, said process comprising:

Illuminating, with light of a wavelength of 365 nm, sapphire substrate having electrical control circuitry thereon, and further having at least a thin layer of at least one type of semiconductor nano-particles with a bandgap disposed on at least a portion of said substrate, said bandgap corresponding to the energy of 365 nm light, said sapphire substrate and said layer of semiconductor nano-particles providing a modulator structure;

applying voltage or current from said electrical control circuitry to induce said nano-particles to change transparency thereby controllably absorbing or transmitting at 365 nm, said nano-particles thereby providing optical modulation at 365 nm; and providing a spatial light pattern responsive to said controllably absorbing or transmitting at 365 nm from said modulator structure.

* * * * *